(12) United States Patent
Yamaji

(10) Patent No.: US 8,394,676 B2
(45) Date of Patent: Mar. 12, 2013

(54) MARKING METHOD FOR SEMICONDUCTOR DEVICE AND SEMICONDUCTOR DEVICE PROVIDED WITH MARKINGS

(75) Inventor: Hideaki Yamaji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 190 days.

(21) Appl. No.: 12/651,656

(22) Filed: Jan. 4, 2010

(65) Prior Publication Data
US 2010/0171214 A1    Jul. 8, 2010

(30) Foreign Application Priority Data

Jan. 6, 2009   (JP) .................. 2009-000587

(51) Int. Cl.
*H01L 23/24*   (2006.01)
(52) U.S. Cl. ................. 438/112; 257/E21.499

(58) Field of Classification Search .............. 257/729, 257/787, E21.499, E23.119, E23.179, 797; 438/112, 124, 127, 106–110, 113
See application file for complete search history.

(56) References Cited

U.S. PATENT DOCUMENTS

| 4,753,863 A | 6/1988 | Spanjer |
| 5,948,466 A * | 9/1999 | Sarashina et al. ............. 118/504 |
| 2002/0052056 A1 | 5/2002 | Minamio et al. |
| 2009/0121347 A1 * | 5/2009 | Kasai et al. .................. 257/729 |

FOREIGN PATENT DOCUMENTS

JP   2002-134660   5/2002

* cited by examiner

*Primary Examiner* — Hoa B Trinh
(74) *Attorney, Agent, or Firm* — Hamre, Schumann, Mueller & Larson, P.C.

(57) ABSTRACT

A marking method is provided for putting markings on the surface of a packaged semiconductor device. The semiconductor device includes a semiconductor chip and a resin package for covering the semiconductor chip. The method includes the steps of forming a groove in the obverse surface of the resin package, and filling the groove with a resin that is visually distinguishable from the resin package.

4 Claims, 5 Drawing Sheets

MARKING METHOD FOR SEMICONDUCTOR DEVICE AND SEMICONDUCTOR DEVICE PROVIDED WITH MARKINGS

BACKGROUND OF THE INVENTION

1. Field of the Invention

The present invention relates to a method for making a mark on the surface of a semiconductor device. The present invention also relates to a semiconductor device marked by the marking method.

2. Background of the Art

Conventionally, various types of semiconductor devices have been proposed. Such a semiconductor device may be printed, on its upper surface, with some characters or marks representing e.g. the model name of the device.

A conventional method for printing on a semiconductor device is described in Japanese Laid-open Patent Publication No. 2002-134660, for example. By this method, as illustrated in FIGS. 6A and 6B of the accompanying drawings, several marking members are embedded in the surface of a semiconductor device.

Specifically, referring to FIG. 6A, a semiconductor chip 91 is mounted on a substrate 92 supported by a lower molding member 90, and an upper molding member 93 is arranged above, facing the lower molding member 90. A transfer sheet 95 carrying marking members 94 is attached to the lower surface of the upper molding member 93. A sealing resin 97 is loaded into the space between the lower molding member 90 and the upper molding member 93 to seal the semiconductor chip 91 and the substrate 92.

Then, as illustrated in FIG. 6B, the transfer sheet 95 is detached from the hardened sealing resin 97, while the marking members 94 are left in the sealing resin 97. The embedded marking members 94 are arranged to provide information for identifying the semiconductor device, and thus the model name of the device can be recognized.

The conventional printing method, however, may cause inconvenience as follows. As seen from the above explanation with reference to FIG. 6A, the marking members 94 need to be attached to the transfer sheet 95 firmly enough so as not to be carried away by the sealing resin 97 being loaded. On the other hand, the same marking members 94 should be detached from the transfer sheet 95 to remain in the resin 97 (see FIG. 6B) when the sheet 95 is removed from the resin 97. Such an ideal behavior of the marking members 94 may not always be expected, and in some cases, incomplete printing may result due to the missing of one or more marking members 94. Such incomplete printing may occur more often as the semiconductor device (and hence each marking member 94) is smaller in size. Further, according to the conventional printing method, the respective marking members 94 need to be positioned accurately on the transfer sheet 95. Such accurate positioning, however, becomes more difficult as the individual marking member 94 is smaller.

SUMMARY OF THE INVENTION

The present invention has been proposed under the circumstances described above. It is therefore an object of the present invention to provide a marking method which enables easy and reliable marking on a semiconductor device. Another object of the present invention is to provide a semiconductor device with markings made by such a marking method.

According to a first aspect of the present invention, there is provided a marking method for a semiconductor device including a semiconductor chip and a resin package covering the semiconductor chip. The marking method comprises the steps of: forming a groove in an obverse surface of the resin package; and filling the groove with a marking resin distinguishable from the resin package.

Preferably, the marking method of the present invention, may further comprise the step of removing excess resin from the obverse surface of the resin package after the step of filling the groove with the marking resin.

Preferably, the groove may be formed by laser beam irradiation onto the obverse surface of the resin package.

Preferably, the resin package may be black or dark gray, while the marking resin is a thermosetting resin that is white or light gray.

According to a second aspect of the present invention, there is provided a semiconductor device comprising: a semiconductor chip; a resin package covering the semiconductor chip and formed with a groove including an irregular inner surface; and a marking resin filled in the groove and distinguishable from the resin package.

Preferably, the resin package may be black or dark gray, while the marking resin may be white or light gray.

Other features and advantages of the present invention will become more apparent from detailed description given below with reference to the accompanying drawings.

DETAILED DESCRIPTION OF THE PREFERRED EMBODIMENTS

Preferred embodiments of the present invention are described below with reference to the accompanying drawings.

Figure 1:
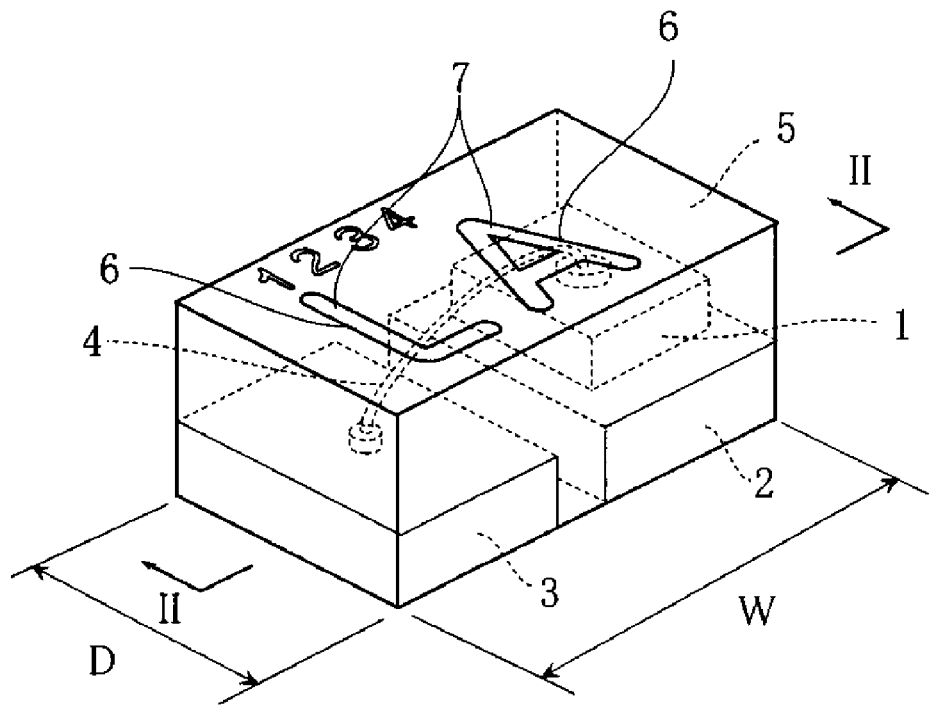
FIG. 1 is a perspective view illustrating a semiconductor device to which a marking method according to the present invention is applicable.
Figure 2:
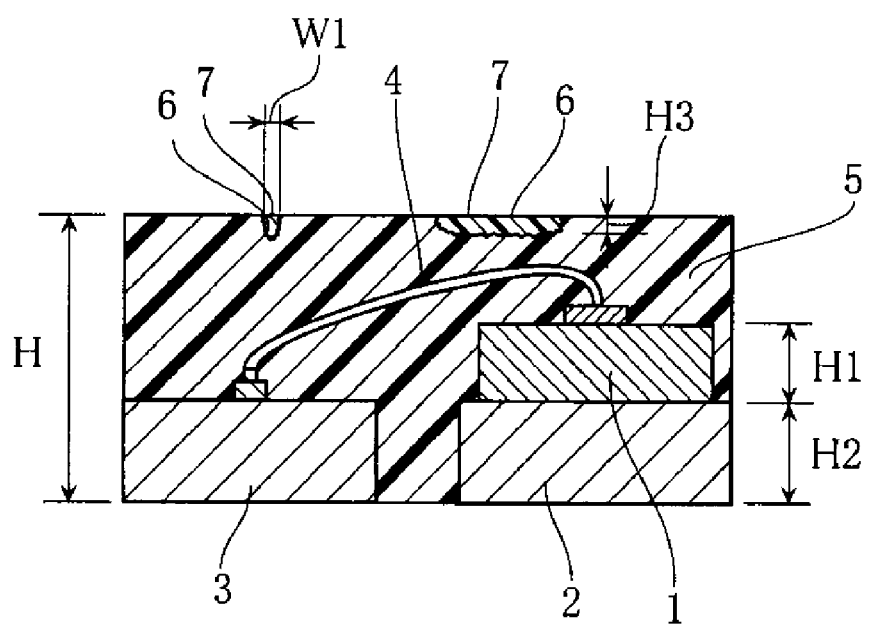
FIG. 2 is a sectional view taken along lines II-II in FIG. 1.

FIGS. 1 and 2 illustrate an example of semiconductor device to which a marking method according to the present invention is applicable. FIG. 1 is a perspective view illustrating principal portions of the semiconductor device. FIG. 2 is a sectional view taken along lines II-II in FIG. 1. The semiconductor device may be a zener diode or a PIN diode, for example.

The semiconductor device includes a semiconductor chip 1, leads 2 and 3 made of metal and spaced from each other, a wire 4 and a resin package 5. The semiconductor device has a width W of about 0.6 mm, a depth D of about 0.3 mm and a height H of about 0.3 mm. The semiconductor device is designed to be surface-mounted on a non-illustrated mount board by utilizing the leads 2 and 3.

The semiconductor chip 1 is provided with two electrodes. One of the electrodes is formed on the lower surface of the semiconductor chip 1, and the other is formed on the upper surface of the chip 1. The semiconductor chip 1 has a thickness of about 0.08 mm. The semiconductor chip 1 is mounted on the obverse surface of the lead 2. In this manner, the electrode on the lower surface of the semiconductor chip 1 is electrically connected to the lead 2. The electrode on the upper surface of the semiconductor chip 1 is electrically connected to the lead 3 via a wire 4. The leads 2 and 3 have a thickness H2 of about 0.1 mm.

The resin package 5 is provided for protecting the semiconductor chip 1 and the wire 4. The resin package 5 is made of a silicone resin which is e.g. black or substantially black (dark gray close to black, for example) to have a light-shielding property. The resin package 5 has an upper surface on which characters or the like representing e.g. the model name or model number of the semiconductor device are provided. Specifically, the upper surface of the resin package 5 is formed with grooves 6 forming the characters. The grooves 6 are filled with a thermosetting resin 7 which is white or substantially white (light gray close to white, for example).

The grooves 6 are formed by laser beam irradiation, which will be described later, and have irregular inner surfaces resulting from the laser irradiation. The laser beam irradiation makes the edges of the grooves 6 in the upper surface of the resin package 5 not straight but jagged. The grooves 6 have a width W1 of about 30 μm and a depth H3 of about 10 to 25 μm.

A marking method for the semiconductor device is described below with reference to FIGS. 3 and 4A-4E.

Figure 3:
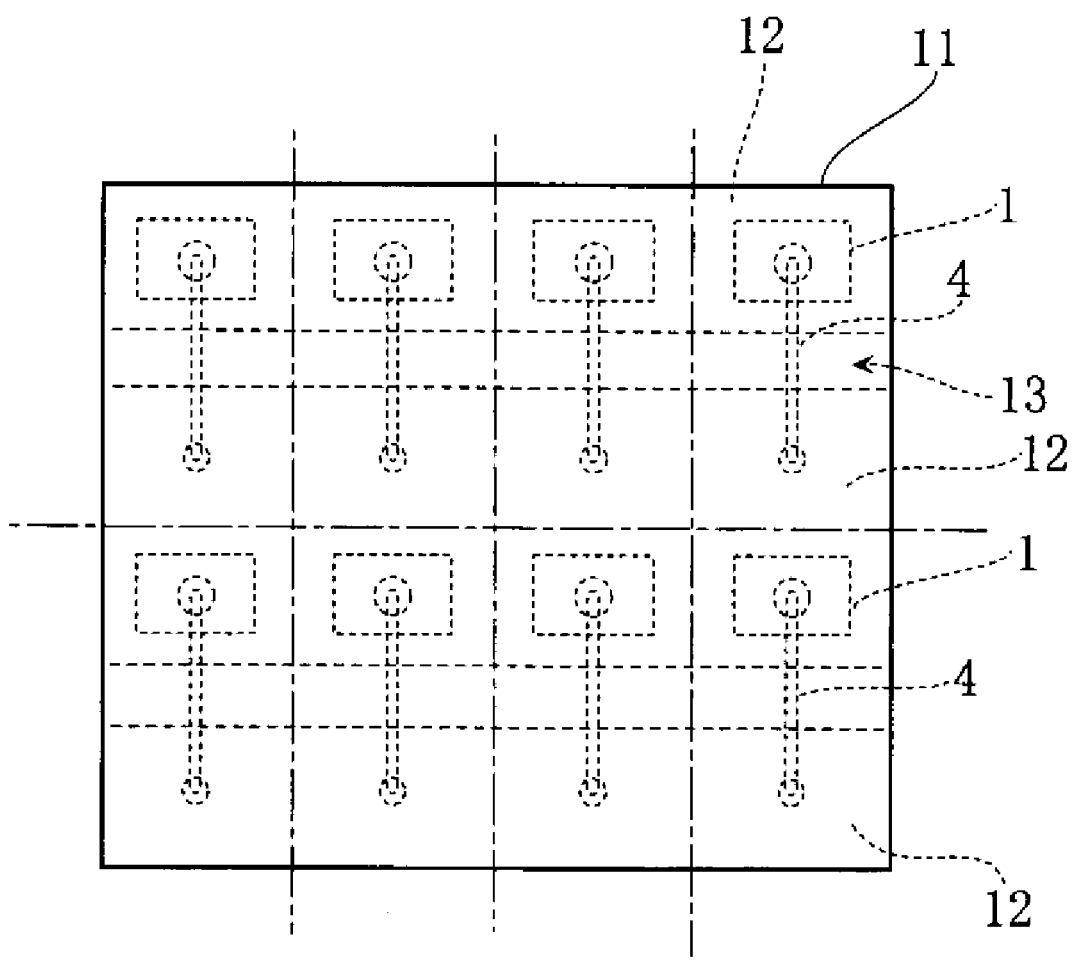
FIG. 3 illustrates the marking method according to the present invention.

A rectangular base board 11 as illustrated in FIG. 3 is prepared. The base board 11 includes a plurality of portions which are connected to each other and each of which is to provide a semiconductor device. The base board 11 may be made by the following process. First, a plurality of bar-shaped lead materials 12, which are to become the leads 2 and 3, are placed at appropriate positions on a non-illustrated base. Then, a plurality of semiconductor chips 1 are mounted at appropriate positions on the lead materials 12. Then, wires 9 are bonded to connect the upper surfaces of the semiconductor chips 1 and the lead materials 12. Then, sealing resin 13, which is to be a resin package 5, is loaded to cover the semiconductor chips 1 and the lead materials 12.

Figure 4A:
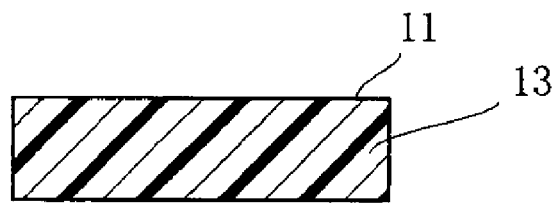
FIG. 4A illustrates a step of the marking method according to the present invention.
Figure 4B:
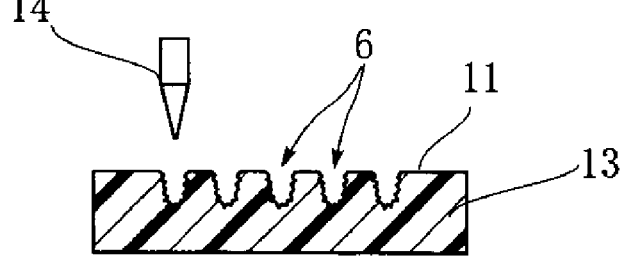
FIG. 4B illustrates another step of the marking method according to the present invention.

As illustrated in FIGS. 4A and 4B, after the base board 11 is prepared, the obverse surface of the base board 11 is grooved at portions corresponding to the characters to be printed, which may represent e.g. the model name. It is to be noted that the FIGS. 4A through 4E illustrate a principal portion of the base board 11. Specifically, a plurality of grooves 6 are formed in the obverse surface of the sealing resin 13 to form the characters to be printed. The grooves 6 are formed by irradiating the obverse surface of the sealing resin 13 with a laser beam emitted from a torch 14 connected to a non-illustrated laser emitting device. As the laser emission device, use may be made of a YVO$_4$ laser which produces a laser beam having a wavelength of e.g. 1064 μm.

As illustrated in FIG. 4B, the grooves 6 formed on the sealing resin 13 have irregular inner surfaces due to the laser irradiation. The edges of the grooves 6 in the obverse surface of the sealing resin 13 may also be irregular, i.e. not straight but jagged. The way to make grooves in the obverse surface of the sealing resin 13 is not limited to the laser beam irradiation using a laser emitting device. For instance, the grooves may be made by etching or by using a mechanical cutting tool. Although the grooves 6 in FIG. 4B are depicted as being arranged in rows, this is merely an example. The arrangement of the grooves 6 depends on the characters to be formed.

Figure 4C:
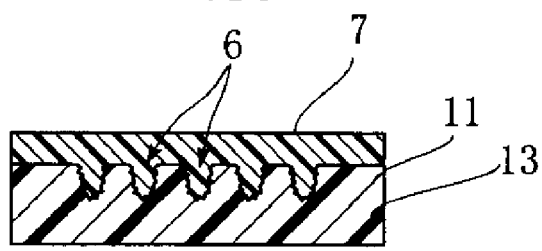
FIG. 4C illustrates another step of the marking method according to the present invention.

Then, as illustrated in FIG. 4C, a thermosetting resin 7 is applied to the obverse surface of the base board 11 to fill the grooves 6 and spread over the non-grooved flat portions. Preferably, the thermosetting resin 7 may be a white or substantially white (such as light gray) resin. However, the thermosetting resin 7 may have any other color as long as the color is visually distinguishable from the surface color of the resin package 5 (which is black or dark gray in this embodiment), thereby allowing the characters or markings to show clearly.

Figure 4D:
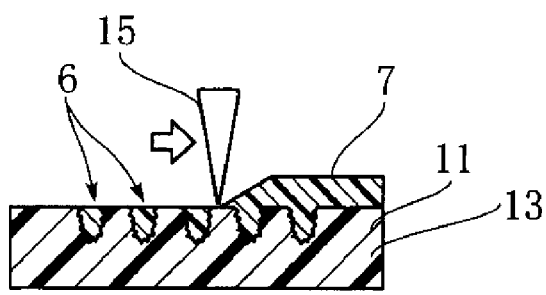
FIG. 4D illustrates another step of the marking method according to the present invention.
Figure 4E:
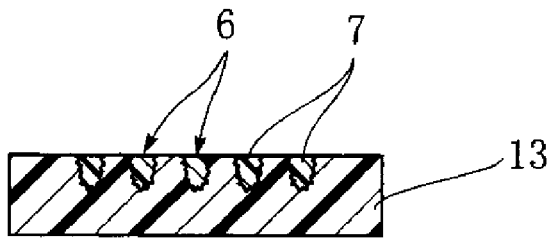
FIG. 4E illustrates the state after the step of FIG. 4D is completed.

Then, as illustrated in FIG. 4D, excess thermosetting resin 7 on the obverse surface of the base board 11 is removed by sweeping e.g. a squeegee 15 along the obverse surface of the base board 11. Here, the "excess" thermosetting resin is part of the thermosetting resin 7 which does not fill anyone of the grooves 6, and therefore is not used for providing the required markings. After the excess thermosetting resin is removed, as illustrated in FIG. 4E, the obverse surface of the sealing resin 13 and the thermosetting resin 7 filled in the grooves 6 are exposed to the air. The removal of the excess thermosetting resin 7 may also be attained by using a chemical technique (e.g. etching) or a mechanical technique (e.g. using a grinder) other than using the squeegee 15.

Then, the exposed thermosetting resin 7 is heated for hardening. Alternatively, the resin 7, without being heated, may simply be left to air drying, since the resin 7, provided for markings, may not be required to have great mechanical strength.

Figure 5:
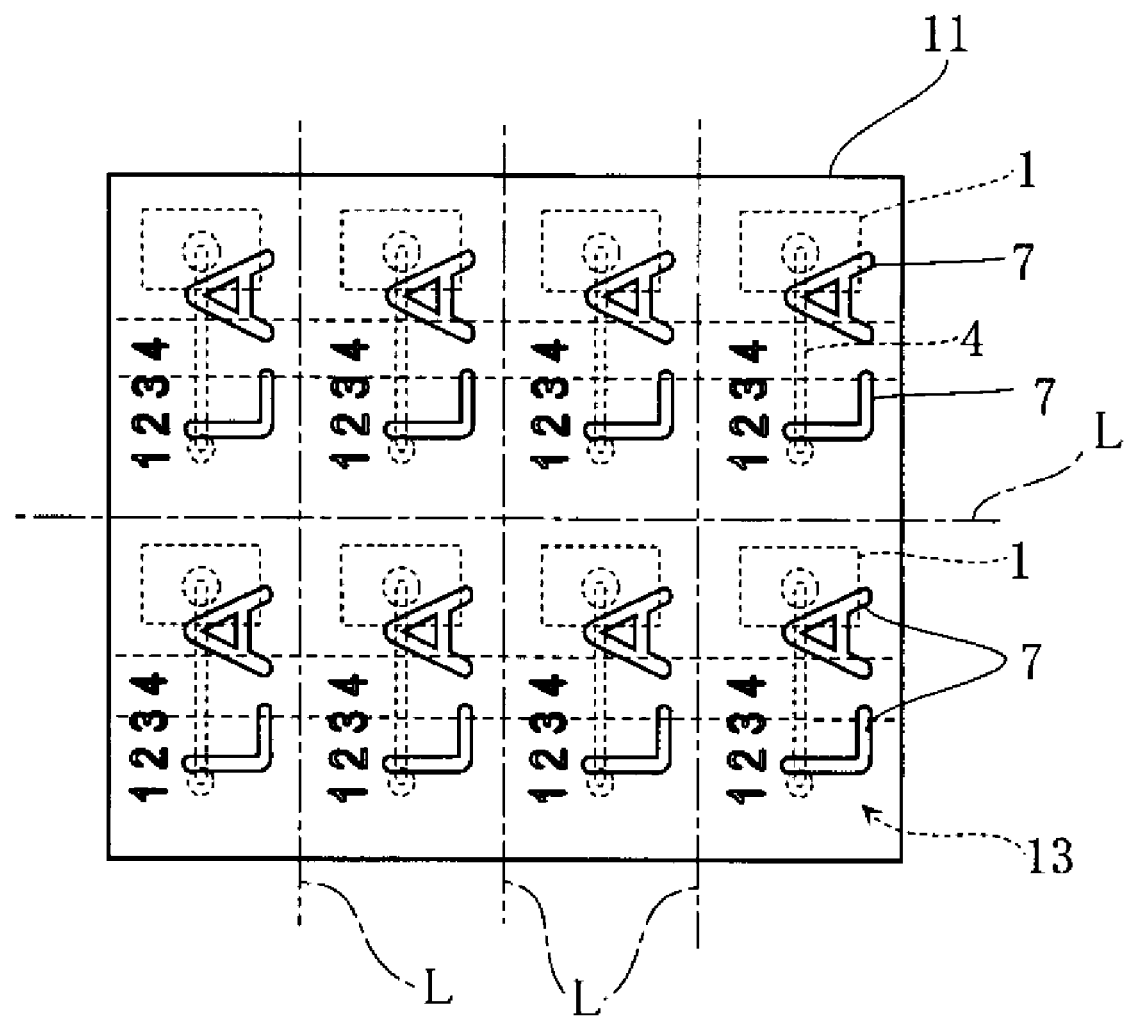
FIG. 5 illustrates a cutting process to produce a plurality of semiconductor devices.
Figure 6A:
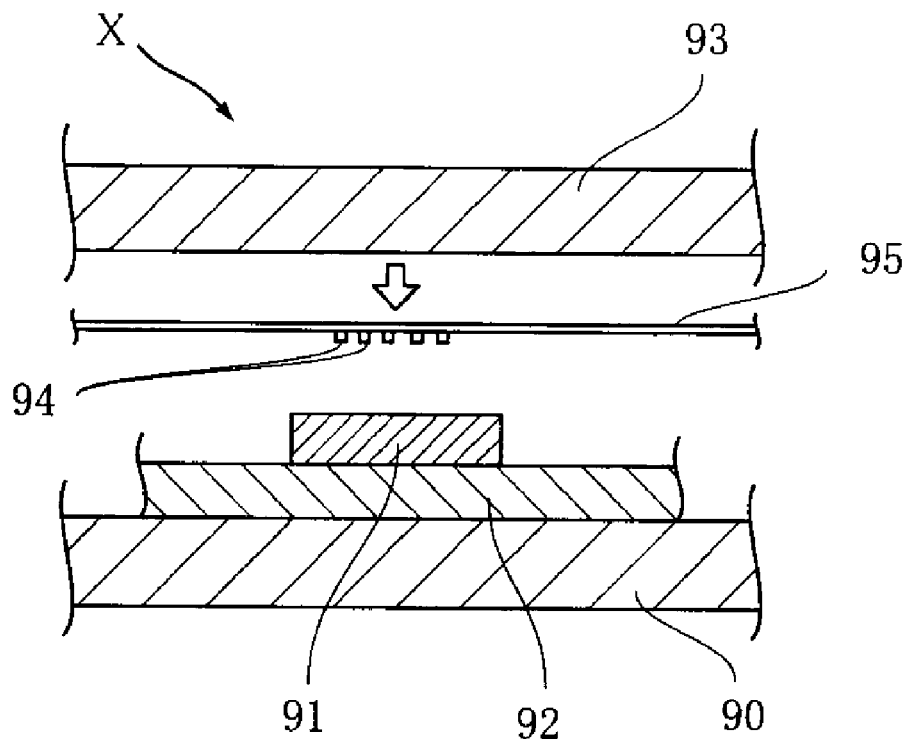
FIG. 6 illustrates a conventional printing method for a semiconductor device.
Figure 6B:
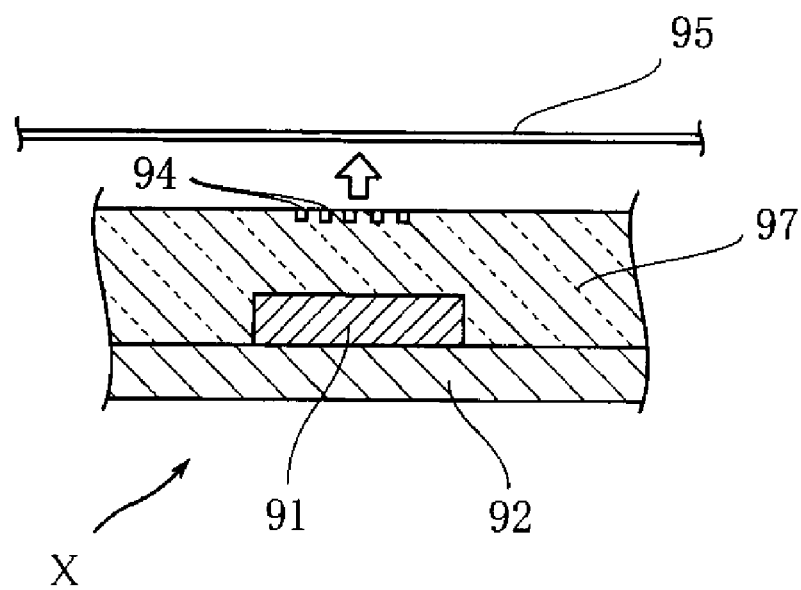

Then, as illustrated in FIG. 5, the base board 11 is cut along the cutting lines L by using a non-illustrated dicing saw into a predetermined size. Thus, a plurality of semiconductor devices each having the structure illustrated in FIGS. 1 and 2 are obtained.

As described above, in the marking method according to the present invention, the obverse surface of the sealing resin 13, which is to become part of the semiconductor device, is grooved by e.g. laser beam irradiation to provide grooves 6, and these grooves 6 are filled with thermosetting resin 7. The thermosetting resin 7 in the grooves 6 is exposed so as to appear as the characters representing e.g. the model name. With this method, characters representing e.g. the model name are formed more easily and reliably than with the conventional printing method. By using a thermosetting resin 7 which is white or light gray, the characters provided on the semiconductor device have high visibility.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A marking method for a semiconductor device including a semiconductor chip and a resin package covering the semiconductor chip, the method comprising the steps of:
   forming a groove in an obverse surface of the resin package of each of a plurality of semiconductor devices present on a base board;
   filling the groove with a marking resin distinguishable from the resin package;

removing excess resin from the obverse surface of the resin package after the step of filling the groove with the marking resin; and cutting the base board to separate the semiconductor device from the plurality of semiconductor devices.

2. The marking method according to claim 1, wherein the groove is formed by laser beam irradiation onto the obverse surface of the resin package.

3. The marking method according to claim 1, wherein the resin package is black or dark gray, and the marking resin is a thermosetting resin that is white or light gray.

4. The marking method according to claim 1, wherein the semiconductor device has a width of 0.6 mm, a depth of 0.3 mm and a height of 0.3 mm.

* * * * *